United States Patent [19]
Horiuchi et al.

[11] Patent Number: 4,949,151
[45] Date of Patent: Aug. 14, 1990

[54] BIPOLAR TRANSISTOR HAVING SIDE WALL BASE AND COLLECTOR CONTACTS

[75] Inventors: Masatada Horiuchi, Koganei; Katsuyoshi Washio, Tokorozawa; Tohru Nakamura, Tanashi, all of Japan

[73] Assignee: Hitachi, Ltd., Tokyo, Japan

[21] Appl. No.: 100,232

[22] Filed: Sep. 23, 1987

[30] Foreign Application Priority Data

Sep. 24, 1986 [JP] Japan ................... 61-223530
Dec. 26, 1986 [JP] Japan ................... 61-308374

[51] Int. Cl.$^5$ ........................... H01L 27/12
[52] U.S. Cl. .......................... 357/49; 357/34; 357/41; 357/43; 357/50; 357/55; 357/68
[58] Field of Search ............... 357/41, 49, 50, 55, 357/43, 68, 34

[56] References Cited

U.S. PATENT DOCUMENTS

| | | | |
|---|---|---|---|
| 4,751,558 | 6/1988 | Kenney | 357/49 |
| 4,812,894 | 3/1989 | Nakamura et al. | 357/49 |
| 4,819,054 | 4/1989 | Kawaji et al. | 357/49 |

Primary Examiner—Edward J. Wojciechowicz
Attorney, Agent, or Firm—Antonelli, Terry, Stout & Kraus

[57] ABSTRACT

A high integration bipolar transistor operable at very high operating speed is disclosed. A semiconductor device of this invention has a semiconductor substrate of a first conductivity type, a buried impurity region formed on the substrate, and a bipolar transistor formed on the buried impurity region, wherein a plurality of monocrystalline active regions defined by the buried impurity region are isolated from each other by an element isolation insulator, the buried impurity region is connected to a graft region formed on the element isolation insulator at least at the side wall of the buried impurity region, and connected to a semiconductor element in a different active region via the graft region.

36 Claims, 11 Drawing Sheets

BIPOLAR TRANSISTOR HAVING SIDE WALL BASE AND COLLECTOR CONTACTS

BACKGROUND OF THE INVENTION

The present invention relates to a semiconductor device having high power and ultra-small bipolar transistors.

A side wall base contact structure (SICOS) is known and is such that it reduces the base-collector parasitic capacitance and improves the operating speed of a bipolar transistor. One example of the side wall base contact structure is shown in FIG. 1. The documents on such structure are, for example, JP-A-56-1556, USSN 443,554 filed Nov. 22, 1982 and JP-A-58-73156, which are incorporated herein by reference.

Referring to FIG. 1, reference number 1 represents a P-type silicon substrate, 2 an $N^+$-type buried layer, and 100 an insulator made of $SiO_2$ film serving as element isolation or base-collector separation. Reference number 3 represents an $N^-$-type collector region, 120 an $N^+$-type diffusion region for connection with the collector electrode, 19 a P-type base region, 150 a graft base region made of polycrystalline silicon film for connection with the base electrode, 20 an $N^+$-type emitter region, 21 a base electrode, 22 an emitter electrode, 23 a collector electrode, and 24 a line interconnecting the collector of a first transistor $T_1$ and the base of a second transistor $T_2$. In a known transistor structure shown in FIG. 1, the base electrode 21 is connected to the base region 19 by using the graft base region 150. Since the graft base region 150 is formed on a thick insulator 100, the base-collector parasitic capacitance becomes small and hence a high speed operation can be attained. In addition, since the graft base region 150 can be formed in a similar manner as of the interconnection layer, the degree of freedom in circuit layout increases to thereby enable the minituarization and high integration of integrated circuits.

SUMMARY OF THE INVENTION

It is difficult to simply say that the advantage of achieving high integration in accordance with the prior art bipolar transistor is sufficient as compared with that of MOS transistors. Namely, in a conventional bipolar transistor, the collector 3 is connected to its electrode on the substrate surface via the $N^+$-type buried layer 2 and the $N^+$-type diffusion region (collector lead-out region) 120. Thus it becomes necessary to use a metal line 24 formed on the substrate surface in order to connect the collector region 3 to the graft base region 150 of another transistor $T_2$, as shown in FIG. 1. In other words, it is essential to form the $N^+$-type diffusion region 120 within the substrate for the connection with the collector electrode so that it is very difficult to reduce the area occupied by a transistor.

Further, as to the distance between $N^+$-type buried layers 2, i.e., the element isolation distance, since the bottom of the element isolation insulator 100 is higher than that of the $N^+$-type buried layer 2, the minimum distance between collectors is determined by the shortest distance between $N^+$-type buried layers 2. Thus it is not possible to make the width of the insulator 100 narrow in order to ensure a desired collector-to-collector breakdown voltage, which is a main obstacle against a high integration.

Furthermore, since the position of the $N^+$-type buried layer 2 is not defined exactly as a result of the epitaxial process, it becomes necessary to have an ample margin of alignment precision for active regions, which is an obstacle against the miniaturization and high integration of elements.

Still further, with the structure of the graft base region 150 on the thick insulator 100, the base-collector parasitic capacitance is remarkably reduced as compared with that of a transistor having a usual structure, and a high speed operation becomes possible. However, reduction in the collector-substrate capacitance is not taken into consideration, thus not achieving a further speed-up of the operation.

Further, the $N^+$-type buried layers 2 are often extended laterally within the substrate depending upon the circuit construction. In such a case, there arises a problem that the collector resistance and the collector-substrate capacitance both increase.

A further problem of the prior art is as follows: Since the introduction of a $P^+$ region from the polycrystalline silicon electrode 150 into the base region 19 for forming a graft base is performed prior to the formation of the emitter region 20 due to some manufacturing restrictions, the impurities already present in the base region are diffused by the heat treatment during the formation of the emitter, and hence the base region is made unnecessarily large. Therefore, the distance between the base and the collector becomes shorter and hence the base-collector breakdown voltage is reduced.

To solve the above problems, the semiconductor device according to the present invention comprises: a semiconductor substrate of a first conductivity type; a first region of a second conductivity type opposite to the first conductivity type formed on the surface of the semiconductor substrate (e.g., high density buried layer: a collector region in a vertical type bipolar transistor, or a base region in a lateral type bipolar transistor); a monocrystalline semiconductor of the second conductivity type formed on the first region and having a second region of the first conductivity type and a third region of the first conductivity type in case of a lateral type bipolar transistor (emitter region and collector region, respectively) or having a second region of the first conductivity type (base region) and a fourth region of the second conductivity type (emitter region or base region) in case of a vertical type bipolar transistor; a fifth region of the second conductivity type at the side wall of the first region (e.g., high density diffusion region); and a conductive layer contacting the side wall of the fifth region and formed on the substrate via an insulator.

With the construction as above, in the case of a vertical type NPN bipolar transistor, the collector region (e.g., a base region in a lateral type PNP bipolar transistor) is connected to the graft collector region (the conductive layer, or the graft base region in the case of the lateral type) via the high density diffusion layer. The graft collector region can be used as an interconnection line per se, or used for the connection to other elements within the substrate. For example, the collector of the first transistor and the base of the second transistor can be interconnected within the substrate via the graft collector region or the graft base region. In other words, such interconnection can be achieved without using an interconnection line on the substrate surface as in the case of the conventional structure. Thus it is not necessary to provide within the substrate a region of a high density diffusion layer (120 in FIG. 1) for the connection to the collector electrode. Therefore, the occupied area can be remarkably reduced as compared with the conventional structure wherein the substrate surface has been used for the connection to the collector electrode or to other elements.

Further, the high density diffusion region is provided around the high density buried layer which is formed under the monocrystalline semiconductor layer serving as an active region surrounded by the element isolation insulator. Therefore, it is not necessary to bury an interconnection line in the element isolation insulator to surround the active region and reduce the collector resistance. Furthermore, it is possible to form the bottom of the element isolation insulator deeper than the bottom of the high density buried layer. The effective distance between adjacent collectors is determined by the path along the bottom of the element isolation insulator. Thus, by making the bottom of the insulator deeper than the bottom of the high density buried layer, a long effective distance between collectors and a high collector-to-collector breakdown voltage are ensured even if the width of the element isolation insulator is very narrow. As above, according to the present invention, the effective distance between collectors can be increased without any problem of breakdown voltage and the minimum isolation distance between elements can be remarkably reduced, thus enabling a high integration.

Conventionally, a high density buried layer, e.g., $N^+$-type buried layer has been formed using antimony (Sb) as impurities in order to prevent auto doping during the epitaxial process. The addition of antimony impurities in the diffusion layer is limited to about $10^{13}$ cm$^{-3}$. Therefore, only an $N^+$-type buried layer of a relatively high resistance of several hundreds $\Omega/\square$ is formed. However, according to the present invention, the $N^+$-type buried layer is surrounded by a high density diffusion layer greater than $10^{20}$ cm$^{-3}$ to effectively reduce the resistance of the $N^+$-type buried layer, and hence to cause the collector current to flow uniformly and circumferentially of the $N^+$-type buried layer.

The high density diffusion region of the second conductivity type formed around the high density buried layer of the second conductivity type also serves to prevent short-circuit between the graft collector region and the substrate of the first conductivity type formed below the high density buried layer.

Further, according to the present invention, the element isolation insulator defining the active region can be formed deeper than the high density buried layer. Thus, it is not necessary to selectively form the high density buried layer, but the high density buried layer can be formed on the whole surface of the substrate, thus obviating the need for an alignment of the active region and the high density buried layer. Therefore, the location of the high density buried layer does not become a criticality as seen in the prior art because of the succeeding epitaxial process. Thus, without having to consider such a requirement of margin of alignment precision, a high integration of elements becomes possible.

Also, since the graft collector region is formed on a thick element isolation insulator, the collector-substrate capacitance and the collector resistance can be remarkably reduced. In addition, since the high density diffusion layer is formed around the high density buried layer, the collector resistance is further reduced.

In the case where a conductive layer is formed, contacting the side wall of the monocrystalline semiconductor layer, on the substrate with an insulator interposed therebetween in order to connect the base region (emitter or collector region in a lateral type) to its electrode via the conductive layer (graft base region), it is possible to narrow the width of a window of the graft base region or high density connection region from which impurities are introduced. This results from the bird's beak phenomenon of the thermally oxidized film formed by selective oxidization of the trench side wall to form an element isolation insulator around the active region monocrystalline semiconductor layer. Therefore, it is possible to prevent the base-collector distance from being shortened and the base-collector breakdown voltage from being reduced, as seen in the conventional structure because of the unnecessary broadening of the base region. Further, with the structure of the present invention, it is possible to form the base region after the emitter region has been formed, thus preventing impurities of the base region from being diffused and undesirably extending the formation of the emitter region.

By virtue of the combination of the reduction of the width of the high density connection region or graft base region and the reduction of the collector resistance and collector-substrate capacitance, the collector-base breakdown voltage is improved and hence a high operating speed can be achieved.

According to an example of the manufacturing method of a semiconductor device having the above-described structure, a trench on the semiconductor substrate is engraved through three steps. Namely, at the first step, a trench is formed shallow. A trench at the second step is engraved by leaving a silicon nitride film for example on the side wall of the trench. Thereafter, a thick thermally oxidized film is selectively formed using the silicon nitride film as a mask.

Namely, the thermally oxidized film is formed with the thicker upper portion because of the bird's beak phenomenon. The portion where the silicon nitride film is left is a region from which impurity diffusion of the first conductivity type from the graft base is performed at the later process. As discussed before, through control of the bird's beak phenomenon, the impurity introducing window can be controlled and the high density connection region can be controlled as desired.

Further, according to an embodiment, an upper portion of the graft base region is formed with a metal silicide film. After the emitter region of the second conductivity has been formed, it is possible to form the base region of the first conductivity type by introducing impurities of the first conductivity into the metal silicide film and by utilizing the phenomenon that the diffusion speed of impurities in the metal silicide film is abnormally fast. Use of such process sequence eliminates the high temperature heat treatment after formation of the base region so that the extension of the base high density diffusion region can be suppressed to large extent. Thus, the distance between the base and the collector can be spaced apart sufficiently, resulting in an improvement of the base-collector breakdown voltage.

Lastly, to form an element isolation region, a trench is engraved at the third step. The bottom surface of the selective oxide film formed after the second step trench engraving is removed to engrave a trench in the substrate which trench reaches at least the bottom of the high density buried layer. After forming such a trench at the third step, the silicon nitride film on the trench side wall is left to form an element isolation insulator through the selective oxidation of the trench bottom surface. Thereafter, high density impurity diffusion is performed through the bottom side wall of the trench to form a high density diffusion region around the high density buried layer, to thereby obtain a low resistance of the collector region.

To solve the above problem, according to another embodiment of the present invention, a trench reaching the bottom of the N+ buried layer is engraved on the Si substrate. An element isolation insulator is formed on the bottom portion of the trench. The connection to the collector region is made via the graft collector formed on the insulator at the side of the N+ buried layer. With the structure as above, since the effective distance between adjacent collectors is a path along the bottom of the element isolation insulator, an effective distance sufficient for ensuring the collector-to-collector breakdown voltage can be attained even at a narrow width of the element isolation insulator, on condition that the trench is formed so as to make the bottom of the insulator deeper than the bottom of the N+ buried layer. Further, in the above structure, the graft collector serves as an interconnection line per se so that interconnection to other elements can be made without using lines on the substrate surface. Thus, the freedom of circuit layout increases to further miniaturize integrated circuits. Since a particular active region for the collector electrode is not needed, it is thus very effective for miniaturization of the active region, i.e., for reduction in the transistor dimension.

According to the present invention, the graft collector region is connected to the N+ buried layer at its side wall and formed on the element isolation insulator defining the active region, thus obviating the need of the active region to take into consideration the region for the connection to the collector electrode. Therefore, the occupied area by a transistor is reduced by an area corresponding to a conventional collector connection region. Further the graft collector region can be formed with a polycrystalline silicon single-layer film, or a laminated film of a polycrystalline silicon film and a metal silicide film or a refractory metal film, thereby reducing the collector resistance. Another function given by the graft collector region is derived from that the connection to the graft collector region can be attained at the whole or part of the graft collector region on the element isolation insulator surrounding the outer sides of the graft collector region. As compared with a conventional connection wherein one end of the collector is used for the connection, the collector resistance can be further reduced without increasing the element area.

According to the present invention, since the bottom of the element isolation insulator is made deeper than the bottom of the N+ buried layer, the effective distance between adjacent collectors can be made sufficiently longer than the distance between adjacent element isolation insulators. Therefore, while maintaining a desired collector-to-collector breakdown voltage, the distance between adjacent isolation insulators can be set sufficiently smaller as compared with the prior art, thus enabling an ultra high integration of semiconductor devices.

According to the present invention, the graft collector region is formed on the element isolation insulator. In this respect, it is necessary to avoid an undesired connection to an adjacent collector region. As a means for allowing the connection only to the desired collector region, according to the present invention, a desired connection region is provided with a non-exposed N+ layer by separating the N+ buried layer from the engraved trench. For the adjacent collector desired to be connected, the trench is formed so as to expose the side wall of the N+ buried layer. With such structure, after the element isolation insulator is selectively formed on the bottom of a trench, the silicon nitride film for example used for the selective formation is removed from the side wall of the trench, and the wet type low temperature oxidation is performed in this condition. The oxidation produces a thick silicon oxide film on the exposed N+ layer and a thin oxide film on the non-exposed N+ layer. Only the thin oxide film is selectively removed and the side wall of the Si substrate is exposed to perform thermal diffusion. Succeedingly, the graft collector region is formed within the trench on the element isolation insulator so that the connection to the N+ buried layer of the desired collector is performed through a newly formed diffusion layer. For the adjacent collector to which the connection is not desired, a thick oxide film formed in self-alignment with the N+ buried layer is interposed therebetween so that no connection is effected.

Besides the above method of forming a graft collector region, it is also possible to deposit and self-align a graft collector region on the side wall of the element isolation trench to which the N+ buried layer is exposed, by means of the spatter ion etching method. In this case, the graft collector region on the element isolation insulator at the trench bottom, except the portion adjacent the trench side wall, is removed.

It is an object of the present invention to eliminate the above problems on the prior art structure, and essentially reduce the occupied area required for the connection to collector region, reduce the isolation distance between elements, and reduce the area by obviating the need for alignment of the active layer with the buried layer which is formed on the semiconductor substrate the latter of an opposite conductivity to that of the buried layer, to thereby achieve minituarization and high integration of elements.

It is another object of the present invention to reduce the collector-substrate capacitance and the collector resistance, to thereby achieve a further speedup.

It is a further object of the present invention to narrow the base high density region to accordingly improve the base-collector breakdown voltage.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
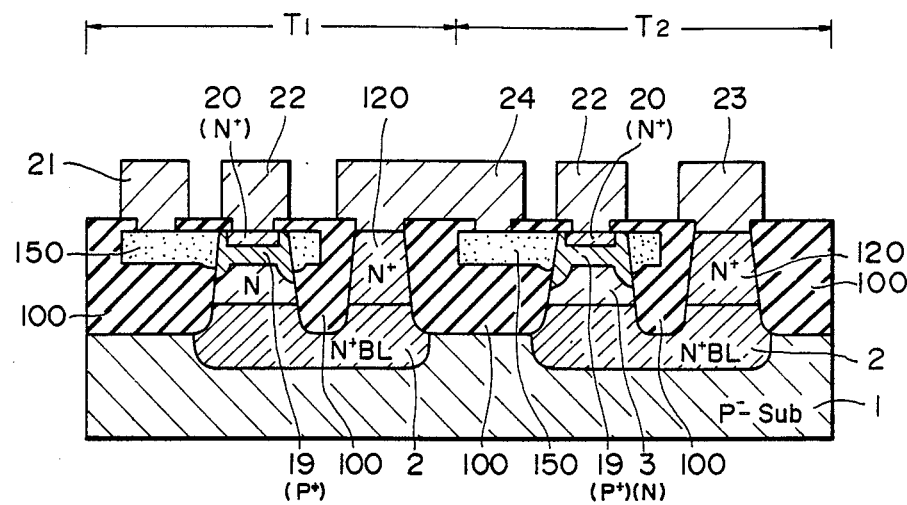
FIG. 1 is a sectional view for explaining the prior art.

The embodiments of the present invention will now be described. It is to be noted that some portions of the main part are enlarged in the drawings. For the purpose of simplicity of the following description, although the material of each element, the conductivity type of semiconductor layer, and the manufacturing condition are shown as being of a particular type, obviously the embodiments illustrated are to be considered by way of example only and are not limited thereto.

EMBODIMENT 1

Figure 2:
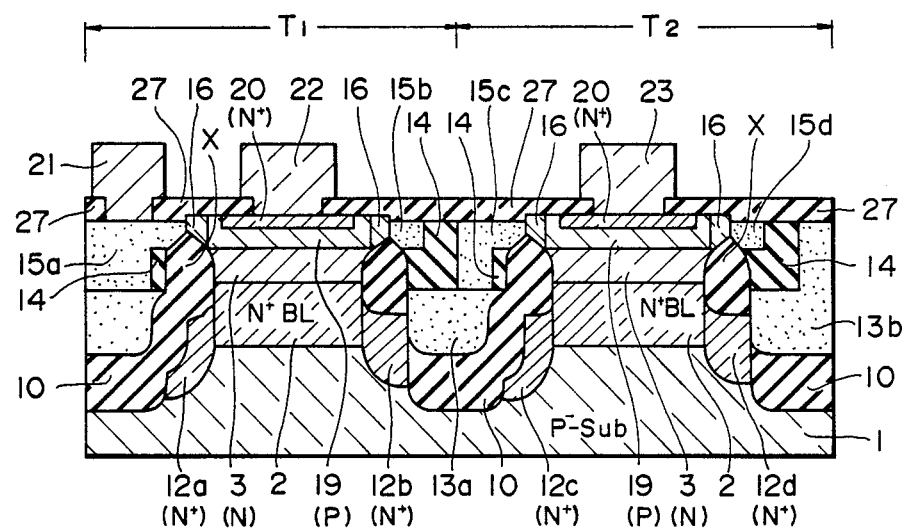
FIGS. 2 to 3G are views used for explaining a first embodiment of the present invention.

FIG. 2 is a sectional view showing a first embodiment of a semiconductor device according to the present invention. In the Figure, reference number 1 represents a P-type Si substrate, 2 an N+-type buried layer, 10 an element isolation insulator made of SiO2 film, 3 an N−-type collector region, 12a to 12d an N+-type diffusion layer formed around the N+-type buried layer 2 for the connection to the collector region, 13a and 13b a graft collector region made of a polycrystalline Si film, 19 a P-type intrinsic base region, 16 a graft base region, 15a to 15d a graft base region made of a polycrystalline Si film for the connection to the base electrode, 20 an N+-type emitter region, 14 and 27 an isolator made of an SiO2 film, 21 a base electrode and 22 an emitter electrode. A collector electrode (not shown) is formed on the substrate surface to connect the graft collector region 13b.

In the semiconductor device of this embodiment, the collector region 3 is connected to the collector electrode via the N+-type buried layer 2, the n+-type diffusion layer 12b, 12d, and the graft collector region 13a, 13b. The intrinsic base region 19 is connected to the base electrode via the graft base regions 16 and 15a to 15d. The graft collector region 13a for the connection to the collector electrode of a transistor $T_1$ is connected to the graft base region 15c of a transistor $T_2$ at above the element isolation insulator 10. Conventionally the collector of the first transistor $T_1$ and the base of the second transistor $T_2$ are connected via an interconnection line on the substrate surface. However, in this embodiment, the interconnection can be performed within the substrate and it is not necessary to provide within the substrate a separate area for the N+ diffusion layer 120 (FIG. 1) for the connection to the collector electrode. The comparison of the conventional structure with the embodiment structure of a semiconductor device necessary for providing a collector electrode and connecting it to the base electrode showed a reduction in occupied area of the embodiment to about ½ of the conventional one.

Further, since the bottom of the element isolation insulator 10 is made deeper than the bottom of the N+-type buried layer 2, the effective distance between collectors is increased. The element isolation distance was reduced to about 0.8 micron which is approximately 1.4 times of a conventional one. Thus, a high integration was achieved without any problem on breakdown voltage.

Furthermore, according to the embodiment, the N+ buried layer 2 can be formed on the entire surface of the substrate so that alignment of the active region with the N+-type buried layer 2 is not necessary. Thus, a margin of alignment precision defining the active region is not necessary, which margin has been required heretofore since the position of the N+-type buried layer 2 cannot be accurately determined because of the epitaxial process. Thus, any attempt at implementing a high integration of elements becomes limited as a result thereof.

Further, according to the embodiment, since the graft collector region 13a, 13b is formed on the element isolation insulator 10, the collector-substrate capacitance was reduced by about 25% of a conventional one. In this embodiment, the maximum impurity concentration of the N+-type diffusion layer 12 was $1.5 \times 10^{20}$ cm$^{-3}$. Forming the N+-type diffusion layer 12 around the N+-type buried layer 2, allowed the collector resistance to be reduce by about 20% of a conventional one.

Still further, as shown in FIG. 2, due to the bird's beak phenomenon of the oxide film 10 formed by selective oxidation of the trench side wall, the width of the introduction window of impurity (boron) from the graft base region 15 was narrowed to about 0.1 micron or less so that the width of the graft base region 16 of a high density P+ region was narrowed. Thus, the reduction of the base-collector breakdown voltage can be prevented from being lowered which might be caused by the short distance between the base and the collector due to an unnecessary broadening of the base region which is characterized of a conventional structure.

By virtue of the combination of the reduction of the width of the graft base 16 and the reduction of the collector resistance and the collector-substrate capacitance, the collector-base breakdown voltage improved by about two times that of a conventional one, and the operating speed ($t_{pd\ min}$) of 100 PS is about twice that of a conventional one.

Figure 3A:
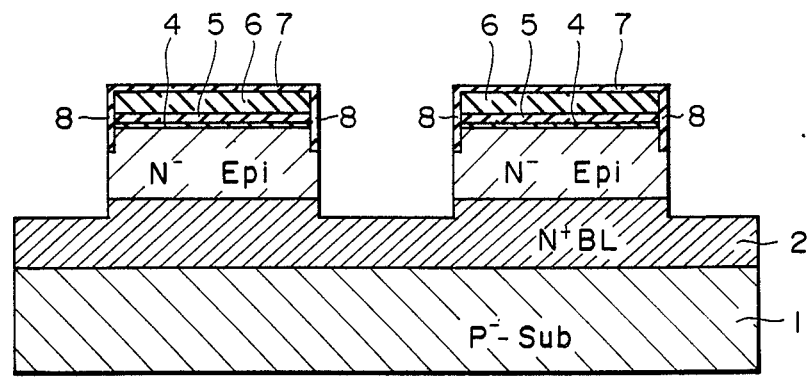

Next, the manufacturing method of a semiconductor device shown in FIG. 2 will be described. FIGS. 3A to 3G are sectional views showing the manufacturing processes for the semiconductor device shown in FIG. 2. First, as shown in FIG. 3A, antimony (Sb) is thermally diffused on the whole surface of the P-type Si substrate 1 to form an N+-type buried layer 2 having a thickness of about 1 micron and an impurity concentration of $3 \times 10^{19}$ cm$^{-3}$. Next, an N-type Si epitaxial layer 3 having a thickness of about 1 micron was formed on the N+-type buried layer 2 by the epitaxial growth method. Thereafter, formed on the epitaxial layer 3 were a silicon oxide film 4 (hereinafter referred to as SiO2 film) having a thickness of about 50 nm by the thermal oxidation method, a silicon nitride film 5 (hereinafter referred to as Si3N4 film) having a thickness of about 120 nm by the CVD method, an SiO2 film 6 having a thickness of about 900 nm, and an Si3N4 film 7 having a thickness of about 90 nm, in this order. The above laminated insulator films 4 to 7 were patterned using a photoresist film as a mask, by the photolithography method and the dry etching method. Next, while leaving the photoresist film and using it as a mask, the epitaxial layer 3 was etched by the thickness of about 0.5 micron. In this condition, a superposed insulator film made of an SiO2 film with about 20 nm thickness by the thermal oxidation and an Si3N4 film with about 90 nm thickness by the CVD method was formed and thereafter, etching in the direction perpendicular to the substrate principal surface was performed by the reactive spatter ion etching process to thereby leave the superposed insulation film 8 only on the side wall of the trench. Next, the etching of the epitaxial layer 3 and a portion of the N+ buried layer 2 was allowed to continue.

Figure 3B:
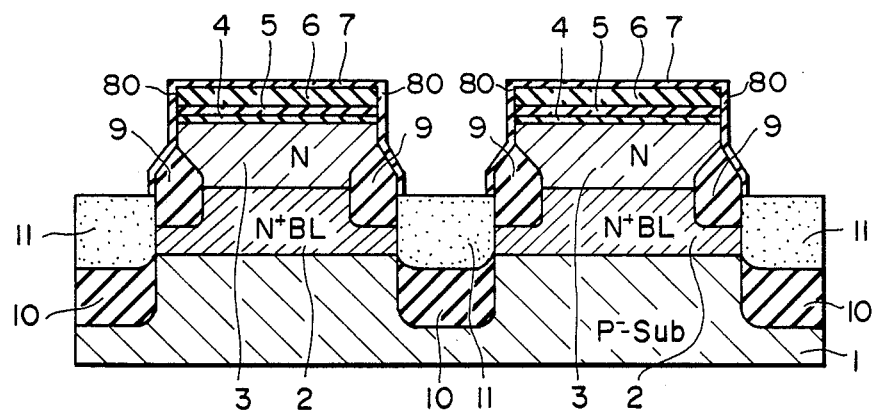

For the structure shown in FIG. 3A, selective oxidation was performed using the superposed insulator film 8 made of the Si₃N₄ and the SiO₂ films as a mask to form an SiO₂ film having a thickness of about 0.4 micron on the side wall and the bottom of the Si trench, as shown in FIG. 3B. Next, the SiO₂ film was etched only in the direction perpendicular to the substrate principal surface by the reactive spatter ion etching to remove the SiO₂ film on the trench bottom and leave that portion only at the side wall to thereby form an SiO₂ film 9. Thereafter, the etching was further conducted down below the bottom of the N⁺-type buried layer 2. In this state, a superposed insulation film made of an SiO₂ film and an Si₃N₄ film was again deposited on the whole surface and thereafter, etching in the vertical direction was performed by the reactive spatter ion etching to leave only that portion on the side wall (not shown). Next, selective thermal oxidation was again performed using the superposed insulation film as a mask to form an SiO₂ film having a thickness of about 0.7 micron only on the trench bottom to use it as an element isolation insulator 10. Prior to the formation of the element isolation insulator 10, boron ion may be implanted as desired to prevent a channel formation (not shown). After forming the element isolation insulator 10 on the trench bottom, the superposed insulator film left on the side wall of the trench was removed by the selective etching. Next, a thick polycrystalline Si film 11 (for forming a diffusion layer) was deposited on and filled in the trench and thereafter etched in the direction perpendicular to the substrate principal surface to make the polycrystalline Si film 11 flat. In this condition, again a superposed insulator film made of an SiO₂ film and an Si₃N₄ film was formed on the whole surface and thereafter, it was selectively left at the exposed surface of the side wall of the trench by the etching in the vertical direction to thereby form a superposed insulator film 80. Next, under the conditions of acceleration energy of 80 KeV, and dose of 1×10¹⁶ cm⁻², phosphorus (P) ion implantation was performed to dope phosphorus into the polycrystalline Si film 11 at high density.

Figure 3C:
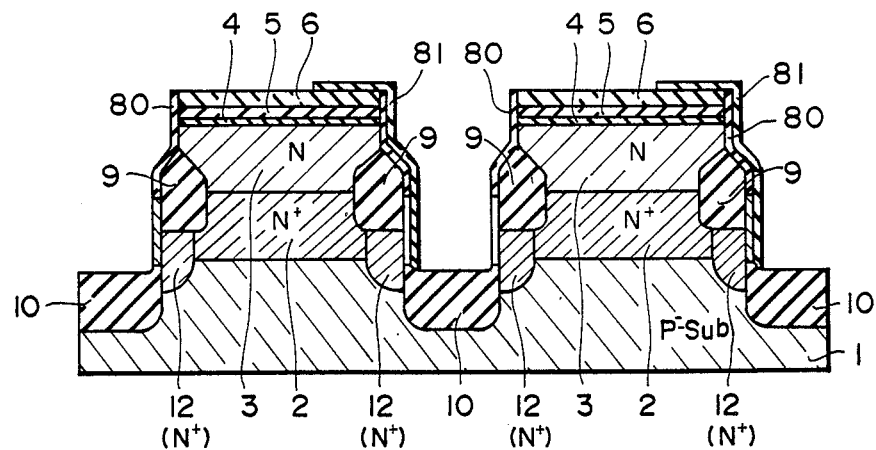

For the structure shown in FIG. 3B, activation and diffusion of the ion implanted phosphorus were performed under N₂ (nitrogen) atmosphere at about 1000° C. and for 30 minutes, to form an N⁺-type diffusion layer 12 around the N⁺-type buried layer 2 as shown in FIG. 3C. Thereafter, the polycrystalline Si film 11 was removed through the etching in the vertical direction using the reactive spatter ion etching (as shown in the Figure, a fraction of the film was left unremoved). Next, a superposed insulator film made of an SiO₂ film and an Si₃N₄ film was again formed on the whole surface and thereafter, the superposed insulator film except the region including at least where the graft collector region is formed was selectively removed to form a superposed insulator film 81.

For the structure shown in FIG. 3C, the exposed surface of the N⁺-type diffusion layer 12 was oxidized using the superposed insulator films 80 and 81 as a mask to form a thick SiO₂ film 101 of about 0.4 micron on the desired surface of the N⁺-type diffusion layer 12. Succeedingly, a polycrystalline Si film was deposited on and filled in the trench to form a polycrystalline Si film 13 which was diffused with phosphorus for etching it flat and reducing the resistance. Thereafter, a superposed insulator film made of an SiO₂ film and an Si₃N₄ film was deposited on the whole surface to etch it in the vertical direction and selectively leave it at the side wall of the trench, thus to form a superposed insulator film 82. Succeedingly, only the polycrystalline Si film 13 was selectively and partially oxidized using the superposed insulator film 82 as a mask, to thereby form an SiO₂ film 14 having a thickness of about 0.3 micron.

Figure 3D:
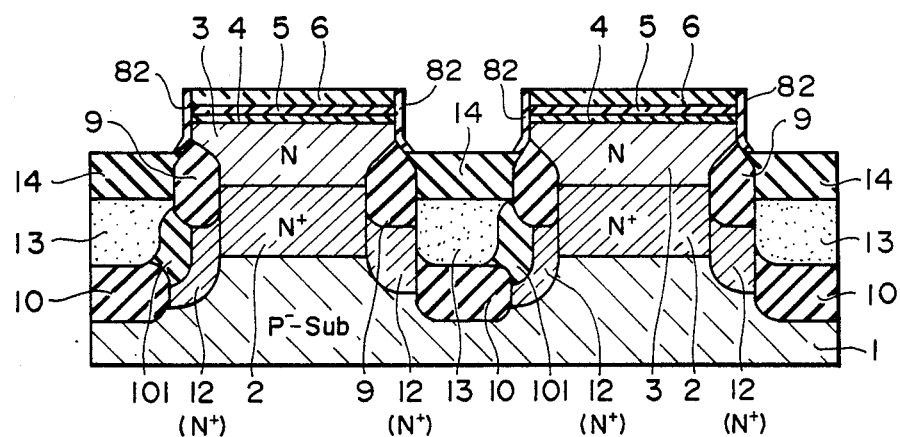
Figures 3E, 3F:
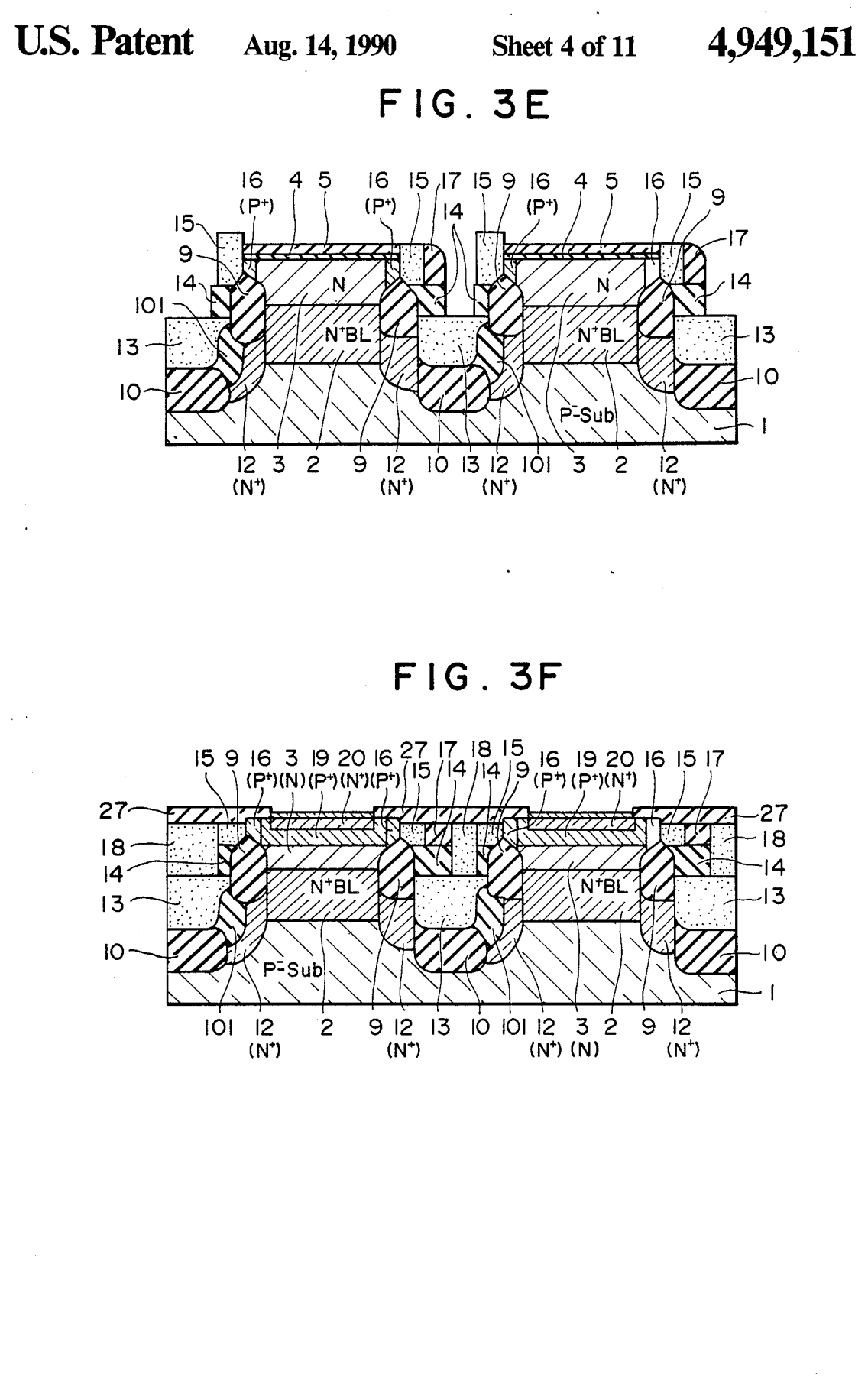

For the structure shown in FIG. 3D, the superposed insulator film 82 was removed by the selective etching and thereafter, as shown in FIG. 3E a polycrystalline Si film 15 for forming a diffusion layer (graft base) was again deposited on the whole surface at about 0.5 micron in thickness. Next, boron was implanted into the polycrystalline Si film 15 at an acceleration energy of 30 KeV and a dose of 1×10¹⁶ cm⁻². Thereafter, a P⁺-type diffusion layer 16 (graft base) was formed by the heat treatment under nitrogen atmosphere at about 900° C. and for 20 minutes. Then, the polycrystalline Si film 15 was selectively etched in the vertical direction to leave it only at the side wall of the trench as shown in the Figure. Succeedingly, a superposed insulator film made of an SiO₂ film and an Si₃N₄ film was deposited on the whole surface and was selectively etched to leave it in order to selectively cover a connection-desired portion of the polycrystalline Si film 15 of the graft base 16. Next, the exposed surface of the polycrystalline film 15 was thermally oxidized using the superposed insulation film as a mask to form an SiO₂ film 17 about 0.3 micron in thickness. Then, using the exposed polycrystalline Si film 15 as a mask, the SiO₂ films 17 and 14 were etched only in the vertical direction and thereafter, the superposed insulator film was removed by the selective etching.

For the structure shown in FIG. 3E, a polycrystalline Si film 18 was deposited on and filled in the recess of the trench (FIG. 3F). Boron was ion-implanted into the polycrystalline Si film 18 at an acceleration energy of 30 KeV and dose of 1×10¹⁶ cm⁻² for the purpose of reducing the resistance of the film 18. A heat treatment was conducted for activating the implanted ions at about 900° C. and for 20 minutes. Thereafter, the polycrystalline Si film 18 was etched to make it flat. Then, the SiO₂ film 6 (FIG. 3D) left on the active region was removed and thereafter, the polycrystalline Si films 15 and 18 were oxidized using the Si₃N₄ film 5 (FIG. 3E) as a mask to form an SiO₂ film 27 about 0.4 micron in thickness. Next, the Si₃N₄ film 5 used in selective formation of the SiO₂ film 27 was removed by the selective etching and thereafter, boron was ion-implanted at acceleration energy of 180 KeV and dose of 4×10¹³ cm⁻² and arsenic (As) was ion-implanted at acceleration energy of 150 KeV and dose of 2×10¹⁶ cm⁻². Thereafter, a p⁺-type intrinsic base region 19 and an N⁺-type emitter region 20 were formed by the heat treatment at about 950° C. and for 15 minutes under nitrogen atmosphere.

Figure 3G:
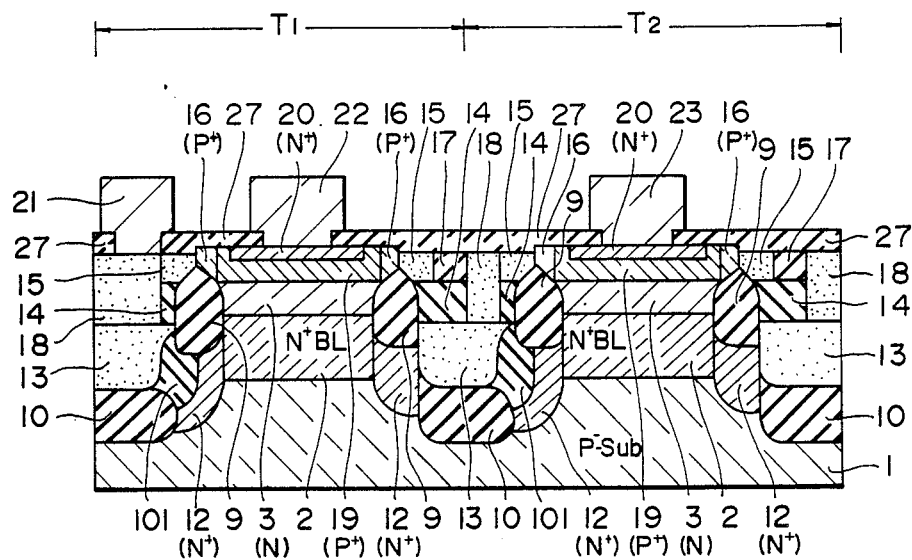

For the structure shown in FIG. 3F, openings were engraved at desired portions of the SiO₂ film 27 as shown in FIG. 3G. A metal film whose main components are aluminum was vapor-deposited and patterned in accordance with a desired circuit arrangement to form electrodes and interconnection lines including a base electrode 21, an emitter electrode 22 and the like, to thereby complete a semiconductor device.

EMBODIMENT 2

Figure 4A:
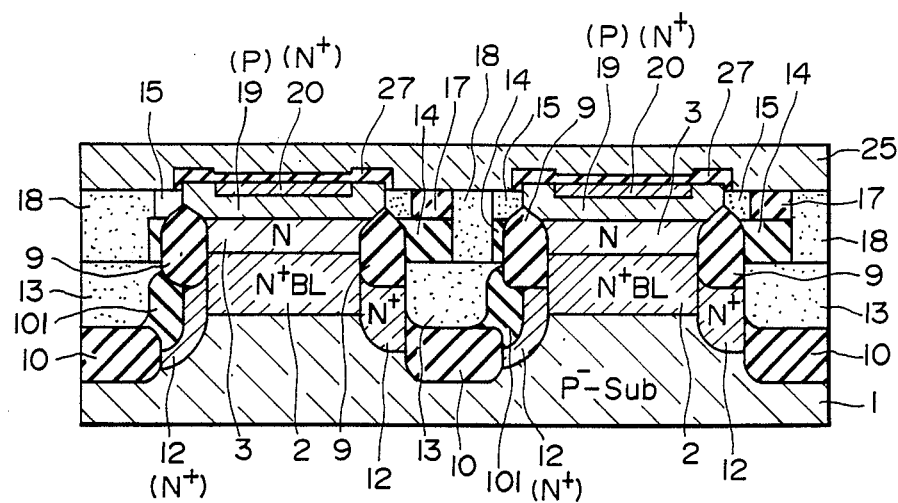
FIGS. 4A and 4B are views used for explaining a second embodiment of the present invention.
Figure 4B:
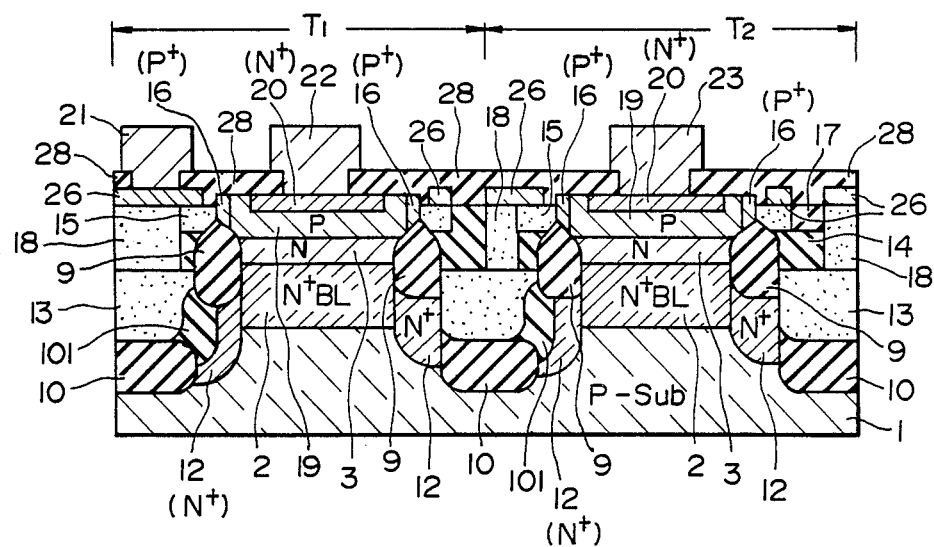

FIGS. 4A and 4B are sectional views showing the manufacturing processes of a second embodiment of a semiconductor device according to the present invention.

In this embodiment, for the structure shown in FIG. 3E of the first embodiment, as shown in FIG. 4A a polycrystalline Si film 18 was filled in the trench and etched to make it flat and thereafter, the polycrystalline Si films 15 and 18 were oxidized using the Si$_3$N$_4$ film 5 (FIG. 3E) as a mask to form an SiO$_2$ film 27. Boron was not implanted into the polycrystalline Si films 15 and 18 nor was the activation process performed. Therefore, at this stage, the graft base region 16 was not formed. After the Si$_3$N$_4$ film 5 used for selective formation of the SiO$_2$ film 27 was removed, boron ion was implanted into the active region to be formed via the SiO$_2$ film 4 (FIG. 3E) at acceleration energy of 180 KeV and dose of $4 \times 10^{13}$ cm$^{-2}$, and arsenic ion was also implanted at acceleration energy of 150 KeV and dose of $2 \times 10^{16}$ cm$^{-2}$. By the heat treatment process at about 950° C. and for 15 minutes under nitrogen atmosphere, the P-type intrinsic base region 19 and the N$^+$-type emitter region 20 were formed. Thereafter, the SiO$_2$ film 27 on the polycrystalline Si films 15 and 18 was selectively removed and thereafter, a tungsten (W) film 25 of about 0.2 micron in thickness was deposited on the whole surface.

For the structure shown in FIG. 4A, boron ion was implanted into the tungsten film 25 at acceleration energy of 80 KeV and dose of $2 \times 10^{16}$ cm$^{-2}$, and subjected to the heat treatment at about 650° C. under nitrogen atmosphere so that the tungsten film 25 reacted with the polycrystalline films 15 and 18 thereby forming a tungsten silicide film 26 on the polycrystalline Si films 15 and 18 through self-alignment as shown in FIG. 4B. Thereafter, tungsten not reacted was removed using hydrogen peroxide aqueous solution. In the above tungsten silicide reaction, the tungsten film 25 does not react with the SiO$_2$ films 17 and 27 so that by the removal process for the tungsten not reacted, a tungsten film or a tungsten silicide film is not left on the SiO$_2$ films 17 and 27. After the tungsten silicide reaction, an SiO$_2$ film was deposited on the whole surface by the CVD method to use it as a surface passivation film 28. Thereafter, a heat treatment at about 950° C. and for 30 minutes was conducted which was intended for reducing the resistance of the tungsten silicide film 26 and for its heat treatment. Boron added in the tungsten silicide film 25 by this heat treatment and by the heat treatment during the previous tungsten silicide process was used with respect to the side wall of the intrinsic base region 19 to thereby form a graft base region 16. Lastly, openings were formed at desired portions of the surface passivation film 28, and a metal interconnection film whose main components were aluminum was deposited on the whole surface and patterned in accordance with the desired circuit arrangement to form electrodes and interconnection lines including a base electrode 21, an emitter electrode 22, a collector electrode 23 and the like.

In the semiconductor device of this embodiment manufactured by the above processes, the graft base 16 was formed after the intrinsic base region 19 and the emitter region 20 were formed. Therefore, the graft base region 16 was not extended unnecessarily by the high temperature processes as seen in the prior art. The base-collector breakdown voltage of the transistor of this embodiment improved by 2V as compared with the transistor of the first embodiment. Further, the combination of the effect of reducing the collector resistance and the collector-substrate capacitance by the N$^+$-type diffusion layer 12 and the effect of graft base region silicide enabled to reduce the base-emitter resistance rbb' of an upside-down transistor using the N$^+$-type buried layer 2 as its emitter, to about 1/10 of a conventional one, and enabled to improve the operating speed by about 10% of the transistor of the first embodiment.

In this embodiment, although the description has been limited only to the tungsten silicide film 26, the metal silicide film may use other refractory metal or transition metal such as molybdenum (Mo), titanium (Ti), platinum (Pt), palladium (Pd), nickel (Ni), chromium (Cr), tantalum (Ta), niobium (Nb), vanadium (V), hafnium (Hf), and zirconium (Zr), or the silicide thereof. The method of forming silicide may use other methods such as chemical vapor-phase reaction.

In the first and second embodiments, a vertical type bipolar transistor whose emitter, base and collector are formed in the vertical direction in the monocrystalline semiconductor layer has been adopted. However, it is obvious that a lateral type bipolar transistor may be adopted wherein the emitter, base and collector are formed laterally in the monocrystalline semiconductor layer. The present invention is also useful for a upside-down transistor operation using the N$^+$-type buried layer 2 as its emitter. Further, the present invention is not limited to an SICOS type bipolar transistor, but obviously is applicable, to a transistor of an ordinary structure wherein the base interconnection or graft region is characterized by being formed on the semiconductor surface.

EMBODIMENT 3

Figure 5A:
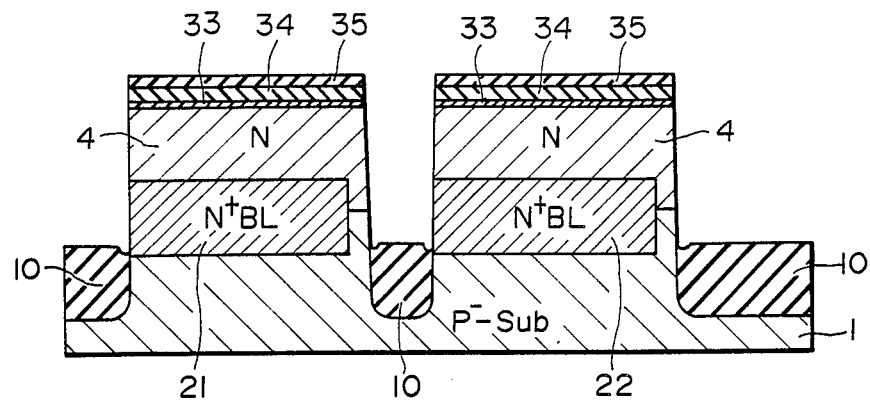
FIGS. 5A to 5F are views used for explaining a third embodiment of the present invention.

FIGS. 5A to 5F are sectional views showing, the sequence of manufacturing processes for the third embodiment. Phosphorus was selectively diffused into the P-type Si semiconductor substrate 1 by the thermal diffusion process to form an N$^+$-type buried layers 21 and 22 having a thickness of 1 micron and an impurity concentration of $3 \times 10^{19}$ cm$^{-3}$. Next, an epitaxial layer 4 having a thickness of 1 micron was formed on the N$^+$-type buried layers 21 and 22 by the epitaxial growth method. Thereafter, formed on the epitaxial layer 4 were an SiO$_2$ film 33 having a thickness of 50 nm by the thermal oxidation process, an Si$_3$N$_4$ film 34 having a thickness of 120 nm by the CVD method, and SiO$_2$ film 35 having a thickness of 900 nm in this order. The laminated insulator 33 to 35 was patterned by the photolithography technique. Next, the Si substrate 1 was etched by 2 microns in thickness using the laminated insulator 33 to 35 as a mask. The trench formed in the Si substrate 1 had a width of 1 micron and was positioned apart from the N$^+$ buried layer 21 by 0.5 micron at the desired contact region to the graft collector region. Next, an SiO$_2$ film by the thermal oxidation and an Si$_3$N$_4$ film by the CVD method were formed on the whole surface and thereafter, the newly formed laminated insulator was etched by the reactive ion spatter method to selectively leave it only at the side wall of the Si trench. Then, an SiO$_2$ film having a thickness of 700 nm was selectively formed on the bottom of the trench by the thermal oxidation to use it as an element isolation insulator 10. Thereafter, the laminated insulator left at the side wall of the Si substrate was selectively removed using hot phosphoric acid solution (FIG. 5A).

Next, a thick SiO$_2$ film having a thickness of 600 nm was formed at the exposed side wall of the N$^+$ buried layers 21 and 22 by the low temperature wet type oxidation at an oxidation temperature of 800° C. An SiO$_2$ film having a thickness of only 180 nm was formed on the side wall of the Si substrate on the side of the exposed N$^+$ buried layer Then, by removing the 180 nm SiO$_2$ film, an SiO$_2$ film 311 having a thickness of 400 nm was selectively left at the side wall of the N+ buried layer. Then a thermal diffusion using POCl$_3$ as a diffusion source was conducted to form an N+ diffusion layer at the exposed portion of the Si substrate on the side wall of the trench, to thereby connect the N+ buried layers 21 and 22 together. Next, a polycrystalline silicon (or amorphous silicon) film was deposited thick and the Si trench was filled with the film and thereafter, the film was left within the trench by the flat etching. The polycrystalline film left within the trench was subjected to a thermal diffusion to reduce a resistance and to use it as graft collector regions 212, 213 connected only to a desired N+ buried layer. Next, an Si$_3$N$_4$ film 36 and an SiO$_2$ film 37 were deposited by the CVD method, and the SiO$_2$ film 37 was etched by the reactive ion spatter method until it becomes flat in the trench (FIG. 5B).

Figure 5B:
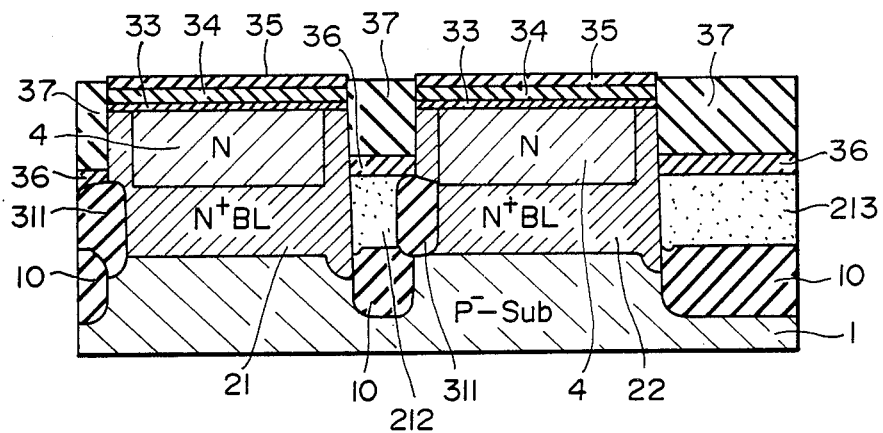

From the structure shown in FIG. 5B, the laminated insulator made of the SiO$_2$ film 35, Si$_3$N$_4$ film 34 and SiO$_2$ film 33 was again selectively etched by the photolithography technique and thereafter, the epitaxial layer 4 was etched by 0.7 micron in thickness using the laminated insulator as a mask. In the above etching, since the graft collector regions 212 and 213 were thick and was not removed at a same time, only the SiO$_2$ film 37 was selectively removed after etching the epitaxial layer 4. Next, after a thermal oxide film and an Si$_3$N$_4$ film were deposited, etching by the reactive ion spatter method was conducted to leave the laminated film 38 made of the SiO$_2$ film and an Si$_3$N$_4$ film only at the side wall of the protruded portion of the epitaxial layer. Using the laminated layer 38 and the Si$_3$N$_4$ layers 34 and 36 as a mask, the exposed surface of the epitaxial layer was subjected to a thermal oxidization to form an SiO$_2$ film having a thickness of 400 nm serving as a base-collector isolation insulator 31. Next, the Si$_3$N$_4$ film on the graft collector regions 212 and 213 was selectively removed by the reactive ion spatter method to expose the polycrystalline film. Then, a W film was vapor-deposited on the whole surface to make it react with the polycrystalline silicon by heating at 700° C. under N$_2$ atmosphere to thereby form tungsten silicides 110 and 111 on the graft collector regions through self-alignment. In the above heat treatment the W film on the Si$_3$N$_4$ film 38 and the SiO$_2$ films 31 and 32 did not react with the polycrystalline silicon. The W film not reacted was removed by hydrogen peroxide aqueous solution (FIG. 5C).

Figure 5C:
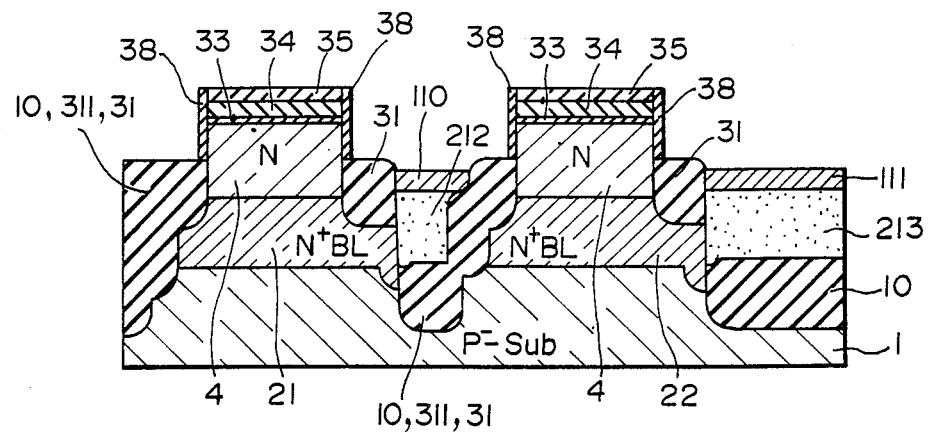
Figure 5D:
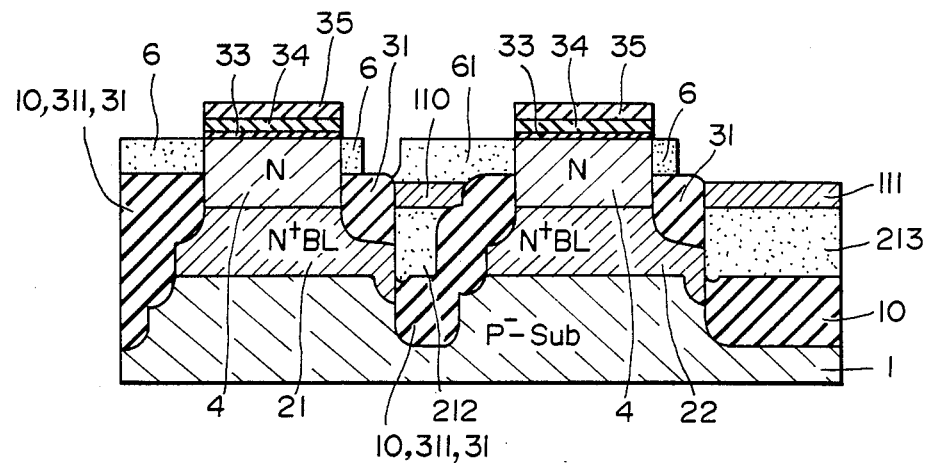

From the structure shown in FIG. 5C, the laminated film 38 made of the Si$_3$N$_4$ film and the SiO$_2$ film formed on the side wall of the Si substrate was removed by hot phosphorus acid diluted hydrofluoric acid aqueous solution and thereafter, a polycrystalline silicon film was deposited by 700 nm in thickness to remove the deposited film on the protruded portion of the Si substrate by the wet etching. Next, the polycrystalline silicon film except those desired to be left was removed using a mask. Thereafter, B ion was implanted into the polycrystalline film at acceleration energy of 30 KeV and dose of $1 \times 10^{14}$ cm$^{-2}$, and activation was conducted by a heat treatment at 900° C. and for 20 minutes to form the graft base regions 6 and 61 (FIG. 5D).

Figure 5E:
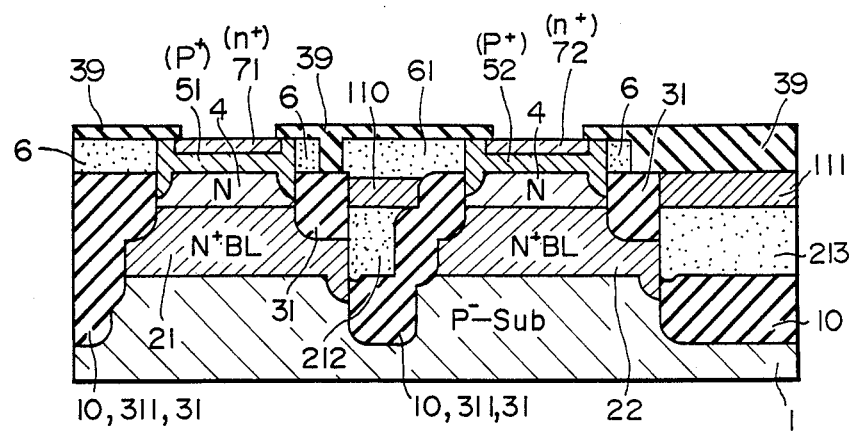

Thereafter, the SiO$_2$ film 35, Si$_3$N$_4$ film 34 and SiO$_2$ film 33 formed on the protruded region of the Si substrate were removed by the wet etching and thereafter, P-type impurity B ion was implanted at acceleration energy 25 KeV and dose of $1 \times 10^{14}$ cm$^{-2}$ to form base regions 51 and 52 having thickness of 0.3 micron. Further, N-type impurity As ion was implanted at acceleration energy of 80 KeV and dose of $2.0 \times 10^{16}$ cm$^{-2}$ to form emitter regions 71 and 72 having a thickness of 0.15 micron. The heat treatment for the activation after the implantation of both ions was performed after implantation of 200 nm was deposited, openings were formed on the emitter regions 71 and 72, the graft base regions 6 and 61 and the graft collector region 213 or 212 (FIG. 5E).

Figure 5F:
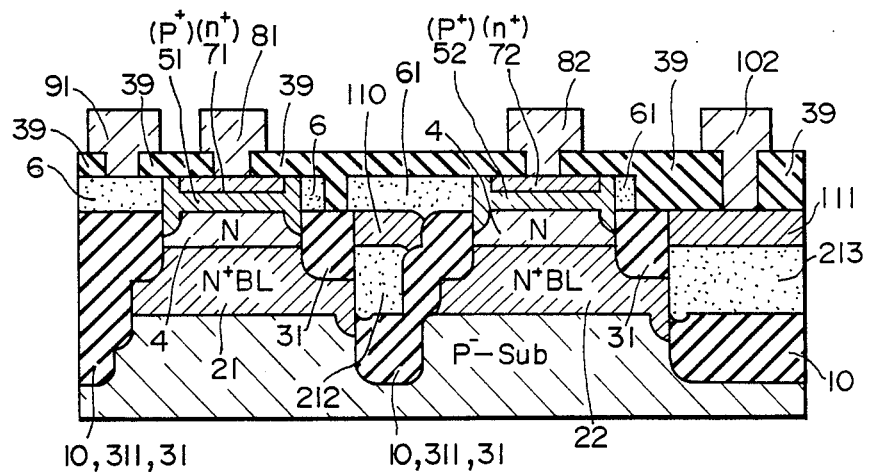

Lastly, vapor-deposition of a metal film whose main components were aluminum and its patterning were conducted to form in accordance with the desired circuit arrangement electrodes and interconnection lines including a base electrode 91, emitter electrodes 81 and 82, collector electrode 102 and the like (FIG. 5F).

In a semiconductor device manufactured in accordance with this embodiment of the processes, the collector electrode was connected to the graft base region at the side wall of the N+ buried layer, and the graft collector base region was formed on the element isolation insulator. Therefore, an active region for connection to the collector terminal becomes unnecessary as opposed to the conventional one. Thus, the cell area of a flip-flop circuit made of two npn transistors was reduced to ⅔ of a conventional one and the substrate-collector capacitance was remarkably reduced. Further, in a semiconductor device according to the present invention, the bottom of the element isolation insulator was formed deeper than the bottom of the N+buried layer to obtain a longer effective distance between collectors. Therefore, even with an element isolation distance of 1 micron which is ¼ of a conventional one, a high integration was achieved without any problem of breakdown voltage. By virtue of the reduction in size of the active region and the reduction in width of an element isolation distance, a memory cell area of a flip-flop circuit was reduced to about ½ of a conventional one. Further, since the graft base region was made of a laminated structure of a polycrystalline silicon film and a metal silicide or a refractory metal film, the collector resistance was reduced from a conventional 100 Ω☐ to 10 Ω☐ or less. In the above embodiment, although the description has been directed to a W silicide film as the metal silicide films 110 and 111, other metals may be used such as Ti, Mo, Pt, Pd, Ta, Zr, Ni, Cr, V, Hf and the like for forming a silicide film or a metal film.

EMBODIMENT 4

Figure 6A:
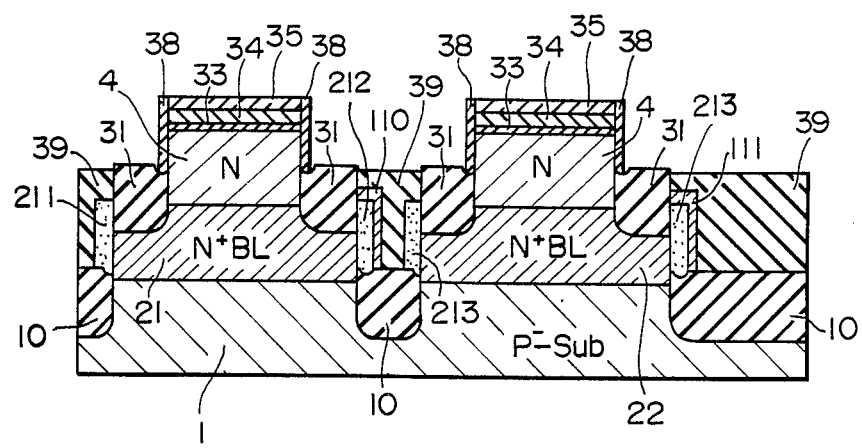
FIGS. 6A to 6C are views used for explaining a fourth embodiment of the present invention.
Figure 6B:
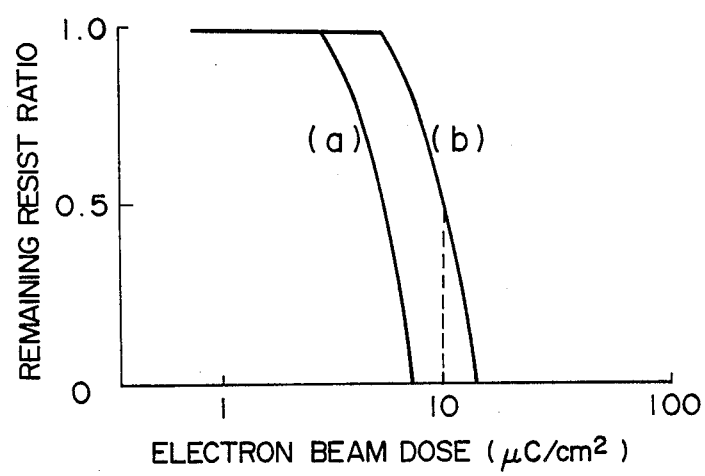
Figure 6C:
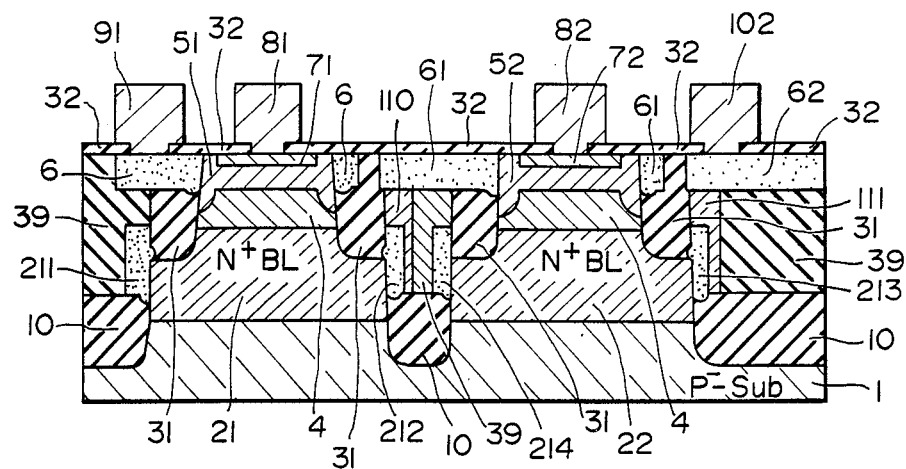

FIGS. 6A to 6C illustrate another embodiment of the present invention. In the second embodiment, prior to forming a trench in which an element isolation insulator is to be formed, an etching of the Si substrate 1 was conducted by the reactive ion etching for defining the region in which a base-collector isolation insulator is to be formed. Succeedingly, a trench in which an element isolation insulator is to be formed was also formed in the Si substrate. The alignment of the trench and the N+ buried layer is not restricted as in the case of the first embodiment, but the N+ buried layer may be exposed to the side wall of the trench. After the second trench was formed in the Si substrate 1, a laminated film made of an SiO$_2$ film and an Si$_3$N$_4$ film was selectively left at the side wall of the trench in a similar manner to the second embodiment. Thereafter, an SiO$_2$ film having a thickness of 700 nm was formed on the surface except the Si substrate principal surface using the Si$_3$N$_4$ film 34 and the SiO$_2$ film 35 as a mask, to thereby form an element isolation insulator 10 and a base-collector isolation insulator 31. Next, the Si$_3$N$_4$ and the SiO$_2$ film left at the side wall of the second trench used for selective formation of the element isolation insulator 31 were selectively removed using the photolithography technique to thereby expose the side wall of the N+ buried layer. Succeedingly, deposition of a polycrystalline silicon film and thermal diffusion of n-type impurity P were conducted to reduce the polycrystalline silicon resistance and connect it to the N+ buried layer. Then, the polycrystalline silicon film was etched in the direction perpendicular to the Si substrate surface by the reactive spatter ion etching to leave it at the side wall of the second Si trench surrounding the N+ buried layer, to thereby form graft collector regions 211, 212 and 213. The polycrystalline silicon film left at the side wall of the Si substrate on the base-collector isolation insulator was selectively removed by the photolithography technique. In the case of the graft collector region at the side wall of the second Si trench, a desired portion of the graft collector region at the side wall of the second Si trench may be selectively removed so as not to surround the entirety of the N+ buried layer. Thereafter, a W film was vapor-deposited by the spatter process, and a Mo film except the desired portion was selectively removed by the photolithography technique. Thereafter, the W film left outside the desired portion was caused to react with the graft collector region made of a polycrystalline film, to thereby form metal silicide films 110 and 111 at desired portions of the graft collector region. Then, an $SiO_2$ film 39 was deposited by the CVD method and etched flat to fill the film in the second Si substrate trench (FIG. 6A).

For the structure shown in FIG. 6A, an electron beam resist liquid RE 5000p (commercial name) was coated on the whole surface and thereafter, electron beams at dose of 10 $\mu C/cm^2$ was aligned roughly to the portion of the metal silicide films 110 and 111 and applied thereto. After the development process, the resist film on the metal silicide films 110 and 111 were removed through self-alignment and the resist film on the other region was left unremoved. Using the above effect of selectively leaving the resist film, the $SiO_2$ film 39 on the W metal silicide films 110 and 111 was selectively removed. The characteristic curve of the effect of selectively leaving the resist film by means of electron radiation is shown in FIG. 6B. The curves show the remaining resist ratio after development relative to the electron dose, wherein the curve (a) represents the case where material whose mass is large, such as W or Mo or the metal silicide thereof, is present under the $SiO_2$ film, and the curve (b) represents the case where the Si substrate is present under the $SiO_2$ film. Namely, with electron radiation at 10 $\mu C/cm^2$, a resist film on the material having a large mass such as a W film is completely removed, whereas a resist film on the Si substrate is left about 50% in thickness.

Using the phenomenon that the reflection amount of electron beam depends on a difference in mass of an underlying material, the $SiO_2$ film 39 was selectively removed. Thereafter, similar to the first embodiment, the $Si_3N_4$ film 38 was removed and the processes following the formation of the graft base regions 6 and 61 were performed (FIG. 6C).

The semiconductor device manufactured by the above processes has similar advantages to those of the semiconductor device manufactured in accordance with the first embodiment. Namely, the advantages include the reduction in area of the transistor active region, the reduction of element isolation distance, and the reduction of collector resistance. In addition, in the semiconductor device according to this embodiment, since the graft collector regions 211 to 214 connected to the N+ buried layer 21 or 22 were formed surrounding the active region, the collector resistance was further reduced, and the degree of freedom of the collector interconnection lines was increased, and the collector-substrate capacitance was reduced.

In the above embodiment, the description has been directed to a W silicide film as the metal silicide films 110 and 111. However, as the metal silicide film a refractory metal having a large mass such as Mo, Pd, Pt, Ta, Hf and Ti or a silieide thereof may be used.

EMBODIMENT 5

Figure 7:
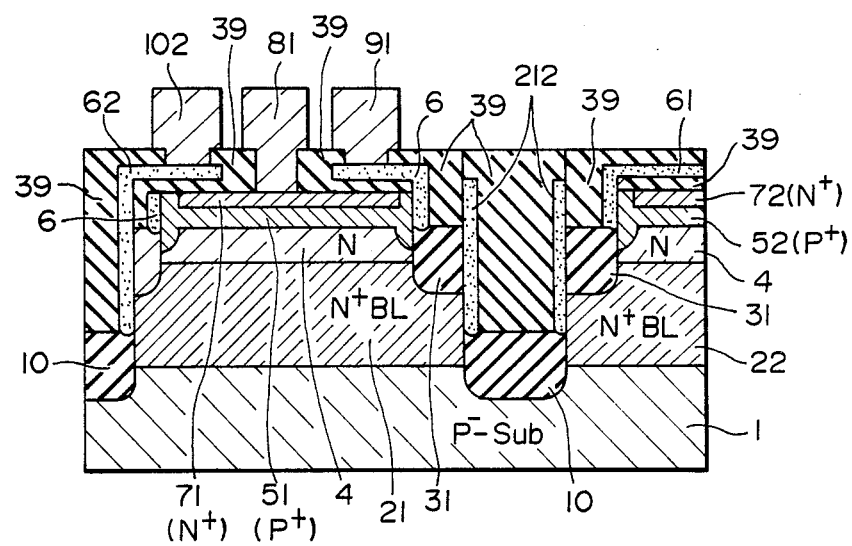
FIG. 7 is a view used for explaining a fifth embodiment of the present invention.

In the semiconductor device of the above embodiment, the graft collector region 62 may be connected at the side wall of the N+ buried layer 21 on the element isolation insulator 10, and may be extended onto the active region to connect it to the collector electrode 102 on the surface of the active region, as shown in FIG. 7. As a result, the emitter area was relatively increased so that a large current and a high speed operation were possible.

In this embodiment, as shown in FIG. 7, there were formed on the P-type semiconductor substrate 1, N+ buried layers 21 and 22, an N-type layer 4, P+-type base regions 51 and 52, N+ emitter regions 71 and 72, polycrystalline silicon films 6, 61, 62 and 212, insulators 31 and 39 and electrodes 81, 91 and 102.

As seen from the foregoing description of the invention, a high density buried layer defining the active region was surrounded by a high density diffusion layer, so that the collector resistance was reduced. Further, the collector can be connected on either one of the side walls of the high density diffusion layer via the graft collector region on the element isolation insulator formed on the bottom of the trench within the substrate, without connecting the collector to the surface of the substrate surface. Therefore, the occupied area by the semiconductor device was reduced to about ½ of a conventional one. Furthermore, the element isolation distance was reduced to about ¼ of a conventional one to thereby enable an ultra high integration. Still further, since the graft base width was narrowed, the base-collector breakdown voltage was increased sufficiently and the collector-substrate capacitance and the collector resistance were reduced so that the operation speed improved more than double the conventional one.

According to the present invention, since the collector was connected to the side wall of the buried layer via the graft collector region on the element isolation insulator without connecting it to the Si substrate surface, the area of the active region was effectively reduced to ⅔ or less of a conventional one. Further, according to the present invention, the bottom of the element isolation film was deeper than the bottom of the N+ buried layer so that the effective distance between collectors became larger than an actual distance and hence the element isolation distance was effectively reduced to ¼ of a conventional one. Furthermore, according to the present invention, the graft collector region was formed with a refractory metal or a metal silicide thereof so that the collector resistance was effectively reduced to 1/10 or less of a conventional one. Still further, the graft collector region was formed surrounding the active region so that the freedom of interconnection to the collector was greatly increased without increasing the occupied area and the collector-substrate capacitance was also reduced to a large extent.

It is further understood by those skilled in the art that the foregoing description has been in connection with the preferred embodiments of the disclosed device and that various changes and modifications may be made in the invention without departing from the spirit and scope thereof.

What is claimed is:

1. A semiconductor device comprising:
    a substrate;
    a buried impurity layer disposed on a principal surface of said substrate as a plurality of isolated buried impurity regions each one having a low resistivity region,
    a plurality of active regions wherein semiconductor elements are formed, at least one of which comprises a collector, base and emitter regions of a bipolar transistor;
    a plurality of vertically protruding regions, each protruding region including one of said buried impurity regions and a corresponding one of said active regions formed thereon, said plurality of vertically protruding regions are respectively extended to an upper principal surface of said semiconductor device and are respectively isolated from each other by element isolation insulators, and each element isolation insulator being disposed in an isolation region and extending in an orthogonally inward direction from said principal surface more deeply into said semiconductor device than said buried impurity regions; and
    graft regions being respectively formed in each isolation region such that each semiconductor element of an active region electrically coupled to a corresponding graft region, located in an adjacent isolation region, via a corresponding buried impurity region and a low resistivity region, wherein electrical coupling between one semiconductor element in one protruding region and another semiconductor element at an active region in another protruding region is effected within an isolation region therebetween through a graft region corresponding to said one semiconductor element.

2. A semiconductor device according to claim 1, wherein one of said graft regions is a graft collector region of said bipolar transistor, said bipolar transistor collector having a collector region formed on a buried impurity region of a corresponding protruding region, a base region formed in said collector region near the principal surface of said device, and an emitter region formed thereon, said emitter region having an upper surface corresponding to said principal surface for coupling to an emitter electrode.

3. A semiconductor device according to claim 2, wherein said bipolar transistor is an NPN transistor, said substrate is a semiconductor substrate of a P-type conductivity, and said buried impurity regions and corresponding low resistivity regions are of an N+-type conductivity.

4. A semiconductor device according to claim 3, wherein said low resistivity regions are high density diffused regions, each one being formed so as to surround and be in electrical contact at an inner periphery thereof with a corresponding buried impurity region and on another, outer peripheral side thereof be in electrical contact with a corresponding graft collector region of an adjacent isolation region.

5. A semiconductor device according to claim 4, wherein each low resistivity region is, furthermore, electrically isolated from any direct electrical contact with the corresponding active region, other than via the corresponding buried impurity region, by a first insulator film of an element isolation insulator in an adjacent isolation region.

6. A semiconductor device according to claim 5, wherein said first insulator film is vertically disposed above a corresponding low resistivity region.

7. A semiconductor device according to claim 6, wherein each of said isolation regions further includes at least a second insulator film disposed so as to extend deeper into said device than said buried impurity regions and said low resistivity regions thereby effecting electrical isolation between adjacent protruding regions and thus between different semiconductor elements.

8. A semiconductor device according to claim 7, wherein each graft region is disposed in a respective isolation region such that electrical contact can only be made to a buried impurity region of one protruding region via a corresponding low resistivity region while it is electrically insulated, via the element isolation insulator thereat, from the buried impurity region and low resistivity region thereof of a different protruding region adjacent thereto.

9. A semiconductor device according to claim 8, wherein each graft region is disposed at least above a corresponding second insulator film in a respective isolation region.

10. A semiconductor device according to claim 9, wherein each graft region is comprised of at least first and second portions, said first portion corresponding to a first graft region for effecting electrical contact with the buried impurity region of a first protruding region adjacent thereto at a side thereof, via a corresponding low resistivity region, and said second portion thereof, formed on said first portion, corresponding to a second graft region for effecting electrical contact with a different semiconductor element at an active region of a second protruding region of the device.

11. A semiconductor device according to claim 10, wherein at least one of said second graft regions is electrically coupled to a graft base region associated with a bipolar transistor of another protruding region.

12. A semiconductor device according to claim 11, wherein said graft regions in said isolation regions are comprised of low resistive polycrystalline silicon material.

13. A semiconductor device according to claim 11, wherein at least said first graft region is formed of low resistive polycrystalline silicon material.

14. A semiconductor device according to claim 13, wherein said second graft region is formed of a metal silicide film.

15. A semiconductor device according to claim 14, wherein said metal silicide film is a selected one of W, Mo, Pd, Pt, Ta, Hf and Ti.

16. A semiconductor device according to claim 1, wherein said low resistivity regions are high density diffused regions, each one being formed so as to surround and be in electrical contact at an inner periphery thereof with a corresponding buried impurity region and on another, outer peripheral side thereof be in electrical contact with a corresponding graft collector region of an adjacent isolation region.

17. A semiconductor device according to claim 16, wherein each low resistivity region is, furthermore, electrically isolated from any direct electrical contact with the corresponding active region, other than via the corresponding buried impurity region, by a first insulator film of an element isolation insulator in an adjacent isolation region.

18. A semiconductor device according to claim 17, wherein said first insulator film is vertically disposed above a corresponding low resistivity region.

19. A semiconductor device according to claim 18, wherein each of said isolation regions further includes at least a second insulator film disposed so as to extend deeper into said device than said buried impurity regions and said low resistivity regions thereby effecting electrical isolation between adjacent protruding regions and thus between different semiconductor elements.

20. A semiconductor device according to claim 19, wherein each graft region is disposed in a respective isolation region such that electrical contact can only be made to a buried impurity region of one protruding region via a corresponding low resistivity region while it is electrically insulated, via the element isolation insulator thereat, from the buried impurity region and low resistivity region thereof of a different protruding region adjacent thereto.

21. A semiconductor device according to claim 20, wherein each graft region is disposed at least above a corresponding second insulator film in a respective isolation region.

22. A semiconductor device according to claim 21, wherein each graft region is comprised of at least first and second portions, said first portion corresponding to a first graft region for effecting electrical contact with the buried impurity region of a first protruding region adjacent thereto at a side thereof, via a corresponding low resistivity region, and said second portion thereof, formed on said first portion, corresponding to a second graft region for effecting electrical contact with a different semiconductor element at an active region of a second protruding region of the device.

23. A semiconductor device according to claim 22, wherein at least one of said second graft regions is electrically coupled to a graft base region associated with a bipolar transistor of another protruding region.

24. A semiconductor device according to claim 23, wherein at least said first graft region is formed of low resistive polycrystalline silicon material.

25. A semiconductor device according to claim 24, wherein said second graft region is formed of a metal silicide film.

26. A semiconductor device for forming at least one bipolar transistor, comprising:
a semiconductor substrate of a first conductivity type;
a buried impurity layer of a second, complementary conductivity type formed on said substrate;
an epitaxial layer being disposed on said buried impurity layer and having an upper surface corresponding to a first principal surface of said device; and
element isolation insulators being formed in an isolation region and extending in an orthogonally inward direction, from said principal surface toward said substrate, more deeply into said device than said buried impurity layer thereby effecting a plurality of isolated protruding regions each one including a buried impurity region, corresponding to a portion of said buried impurity layer, and an active region vertically stacked thereon, corresponding to a portion of said epitaxial layer, wherein in a first of said active regions a bipolar transistor having a collector, base and emitter regions is formed, said collector region being of said second conductivity type having a lower main surface corresponding to a lower principal surface of said first active region, and having formed therein a base region of said first conductivity type and an emitter region of said second conductivity type near said first principal surface,
wherein said base region has a graft base region formed at an upper side corner of said first active region for connection to either an electrode wiring at said first principal surface or to a further graft region corresponding to a different semiconductor element, said further graft region being located in an adjacent isolation region for connection to another active region via a respective buried impurity region associated therewith in a second protruding region, and
wherein the collector region of the bipolar transistor in said first active region is electrically connected to a corresponding graft collector region formed in another adjacent isolation region via the corresponding buried impurity region thereof for connection, within said another adjacent region, to an active region of a semiconductor element associated with a different protruding region.

27. A semiconductor device according to claim 26, wherein the base region of the bipolar transistor in said first active region is electrically coupled to a base electrode thereof via a first low resistivity graft base region in direct electrical contact with an upper side corner of said first active region, at said base region thereof, and a second low resistivity polycrystalline silicon region is included which is in electrical contact with said base electrode, and wherein said second low resistivity polycrystalline silicon region is disposed in the adjacent isolation region.

28. A semiconductor device according to claim 27, wherein said graft collector region of said bipolar transistor of said first active region includes at least one low resistivity polycrystalline region which is in electrical contact with a base graft region of a different bipolar transistor via another second low resistivity polycrystalline silicon region formed in said another adjacent isolation region.

29. A semiconductor device according to claim 28, wherein said buried impurity regions include low resistance regions.

30. A semiconductor device according to claim 28, wherein each graft collector region is disposed at least above a corresponding insulating film in a corresponding isolation region and wherein each graft collector region includes a third low resistivity polycrystalline silicon region and a fourth low resistivity polycrystalline silicon which is formed on said third polycrystalline silicon region, said third and fourth polycrystalline silicon regions effecting an electrical connection within an isolation region between a collector region of one bipolar transistor and a base region of another bipolar transistor.

31. A semiconductor device having a plurality of vertical type bipolar transistors, each one having a collector region, a base region and an emitter region, formed on a semiconductor substrate, comprising:
a plurality of vertically protruding regions, each protruding region including a buried impurity region of a buried impurity layer formed on an upper surface region of said semiconductor substrate and a corresponding active region vertically stacked thereon, each one of said active regions having an upper surface corresponding to a principal surface of said device and having formed therein the collector region, in electrical contact with a corresponding buried impurity region, and base and emitter regions of a corresponding one of said bipolar transistors;

element isolation insulators being disposed in respective isolation regions extending in an orthogonally inward direction, from said principal surface toward said substrate, more deeply into said device than said buried impurity layer; and graft regions formed in respective isolation regions for effecting at least an electrical connection within an isolation region itself of a bipolar transistor of one protruding region with another bipolar transistor at an active region of a different protruding region, wherein said graft regions in a first isolation region include at least a first graft region electrically connected to a side surface of the buried impurity region corresponding to the protruding region of said one bipolar transistor and a second graft region, in electrical contact with said first graft region, for effecting connection with said another bipolar transistor at a corresponding active region, said graft regions being electrically isolated from at least said semiconductor substrate via at least one insulating film in said first isolation region.

32. A semiconductor device according to claim 31, wherein in an active region of a protruding region wherein said one bipolar transistor is formed, said collector region has a lower main surface corresponding to a lower surface of said active regions, and has formed therein a base region and an emitter region near said principal surface, wherein said base region has a graft base region formed at an upper side corner of the corresponding active region for connection via a low resistivity polycrystalline silicon region to either an electrode wiring, or to graft collector series-connected regions corresponding to a bipolar transistor in a different protruding region for effecting an electrical connection therewith, via a corresponding buried impurity region thereat, said graft collector regions and said low resistive polycrystalline silicon region being disposed in a second isolation region of said device.

33. A semiconductor device according to claim 32, wherein each of said graft regions is a low resistivity polycrystalline silicon region.

34. A semiconductor device according to claim 31, wherein each of said graft regions is a low resistivity polycrystalline silicon region.

35. A semiconductor device according to claim 31, wherein said first graft region is a low resistivity polycrystalline silicon region corresponding to a graft collector region of said one bipolar transistor and is in direct electrical connection with a side wall of the corresponding buried impurity region, said first graft being formed so as to surround said buried impurity region, wherein said second graft region corresponds to a graft base region of said another bipolar transistor and is formed on said first graft region through an interconnection wiring film.

36. A semiconductor device according to claim 35, wherein said first and second graft regions are low resistivity polycrystalline silicon regions and said wiring film is a metal silicide and is selected from one of W, Mo, Pd, Pt, Ta, Hf and Ti.

* * * * *